(12) United States Patent
Lee et al.

(10) Patent No.: US 12,256,563 B2
(45) Date of Patent: Mar. 18, 2025

(54) SUPERJUNCTION SEMICONDUCTOR DEVICE HAVING REDUCED SOURCE AREA

(71) Applicant: DB HiTek Co., Ltd., Bucheon-si (KR)

(72) Inventors: Ji Eun Lee, Bucheon-si (KR); Myeong Bum Pyun, Incheon (KR); Yong Sin Han, Jeonju-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 389 days.

(21) Appl. No.: 17/670,932

(22) Filed: Feb. 14, 2022

(65) Prior Publication Data

US 2022/0271121 A1 Aug. 25, 2022

(30) Foreign Application Priority Data

Feb. 25, 2021 (KR) .................. 10-2021-0025374

(51) Int. Cl.
*H01L 29/06* (2006.01)
*H10D 30/66* (2025.01)
*H10D 62/10* (2025.01)
*H10D 62/17* (2025.01)

(52) U.S. Cl.
CPC ......... *H10D 62/111* (2025.01); *H10D 30/665* (2025.01); *H10D 62/127* (2025.01); *H10D 62/393* (2025.01)

(58) Field of Classification Search
CPC ............. H01L 29/0634; H01L 29/0696; H01L 29/1095; H01L 29/7811; H01L 29/7802; H10D 62/11; H10D 62/127; H10D 62/393; H10D 62/138; H10D 30/665; H10D 30/803; H10F 30/245
See application file for complete search history.

(56) References Cited

U.S. PATENT DOCUMENTS

| | | | |
|---|---|---|---|
| 6,611,021 B1* | 8/2003 | Onishi | H01L 29/66712 257/E29.066 |
| 6,673,679 B1* | 1/2004 | Miyasaka | H01L 29/66712 257/E21.418 |
| 6,683,347 B1* | 1/2004 | Fujihira | H01L 29/7395 257/E29.198 |
| 7,301,203 B2 | 11/2007 | Lee et al. | |
| 7,655,981 B2 | 2/2010 | Lee et al. | |
| 8,673,700 B2* | 3/2014 | Yedinak | H01L 29/0634 257/302 |
| 8,772,868 B2* | 7/2014 | Yedinak | H01L 29/7813 257/341 |
| 8,786,010 B2* | 7/2014 | Yedinak | H01L 29/7813 438/529 |

(Continued)

FOREIGN PATENT DOCUMENTS

| | | |
|---|---|---|
| JP | 2017-37997 A | 2/2017 |
| KR | 10-2005-0052597 A | 6/2005 |
| KR | 10-2017-0022418 A | 3/2017 |

*Primary Examiner* — Ida M Soward
(74) *Attorney, Agent, or Firm* — Andrew D. Fortney; Central California IP Group, P.C.

(57) ABSTRACT

A superjunction semiconductor device having a reduced source area and a method of manufacturing the same and, more particularly, to a semiconductor device and a method of manufacturing the same, in which the semiconductor device realizes a reduction in the area of a source in a body region to reduce the current during a short circuit fault, thus delaying a temperature increase and increasing the time before temperature-related device destruction.

13 Claims, 11 Drawing Sheets

(56) References Cited

U.S. PATENT DOCUMENTS

| | | | |
|---|---|---|---|
| 8,836,028 B2* | 9/2014 | Yedinak | H01L 29/0878 |
| | | | 257/341 |
| 8,946,814 B2* | 2/2015 | Anderson | H01L 29/0634 |
| | | | 438/270 |
| 9,082,845 B1* | 7/2015 | Seok | H10D 62/106 |
| 9,293,528 B2* | 3/2016 | Hirler | H01L 29/0615 |
| 9,431,249 B2* | 8/2016 | Pattanayak | H01L 29/7811 |
| 9,431,481 B2* | 8/2016 | Lee | H01L 29/66712 |
| 9,570,607 B2* | 2/2017 | Schulze | H01L 29/0634 |
| 10,529,799 B2* | 1/2020 | Furuhashi | H01L 29/0865 |
| 2005/0116313 A1 | 6/2005 | Lee et al. | |
| 2006/0006458 A1* | 1/2006 | Motai | H01L 29/0634 |
| | | | 257/E29.066 |
| 2007/0001194 A1* | 1/2007 | Ono | H01L 29/7811 |
| | | | 257/E29.066 |
| 2007/0267664 A1* | 11/2007 | Sumi | H01L 29/0634 |
| | | | 257/E29.066 |
| 2008/0017897 A1* | 1/2008 | Saito | H01L 29/7811 |
| | | | 257/E29.136 |
| 2008/0211053 A1 | 9/2008 | Lee et al. | |
| 2009/0079002 A1* | 3/2009 | Lee | H10D 30/668 |
| | | | 257/E23.001 |
| 2019/0206988 A1* | 7/2019 | Padmanabhan | H10D 64/117 |

* cited by examiner

SUPERJUNCTION SEMICONDUCTOR DEVICE HAVING REDUCED SOURCE AREA

CROSS REFERENCE TO RELATED APPLICATION

The present application claims priority to Korean Patent Application No. 10-2021-0025374, filed Feb. 25, 2021, the entire contents of which are incorporated herein for all purposes by this reference.

BACKGROUND OF THE INVENTION

Field of the Invention

The present disclosure relates to a superjunction semiconductor device having a reduced source area and a method of manufacturing the same and, more particularly, to a semiconductor device and a method of manufacturing the same, the semiconductor device being configured to realize reduction in an area of a source in a body region to reduce a value of the current in a short circuit fault (hereinafter referred to 'a short circuit current', or Isc), thus delaying a junction temperature increase and increasing the time before device destruction.

Description of the Related Art

In general, high voltage semiconductor devices, such as a MOS field effect transistor (MOSFET) for power and an insulated gate bipolar transistor (IGBT), have a source and a drain respectively on an upper surface and a lower surface of a drift region in the high voltage semiconductor device. The high voltage semiconductor device has a gate insulator film on the upper surface of the drift region (adjacent to the source) and a gate electrode on the gate insulator film. The drift region provides, for a drift current flowing from the drain to the source, not only a conductivity path when the high voltage semiconductor device is on, but also a depletion region that is vertically extended by a reverse bias voltage applied when the high voltage semiconductor device is off.

A breakdown voltage of the high voltage semiconductor device is determined by the characteristic of the depletion region in the drift region as described above. In the high voltage semiconductor device, in order to minimize conduction loss occurring in the on state and secure a fast switching speed, research to reduce the turn-on resistance of the drift region providing the conductive path has been carried out. In general, as a known method, the turn-on resistance of the drift region may be reduced by increasing dopant density in the drift region. However, when the dopant density in the drift region is increased, there is a problem in that the breakdown voltage decreases as the space charge in the drift region increases.

In order to solve the above problem, a high voltage semiconductor device having a superjunction structure, which includes a new type of junction structure such that the turn-on resistance can be reduced and a high breakdown voltage can be secured, has been developed.

Figure 1:
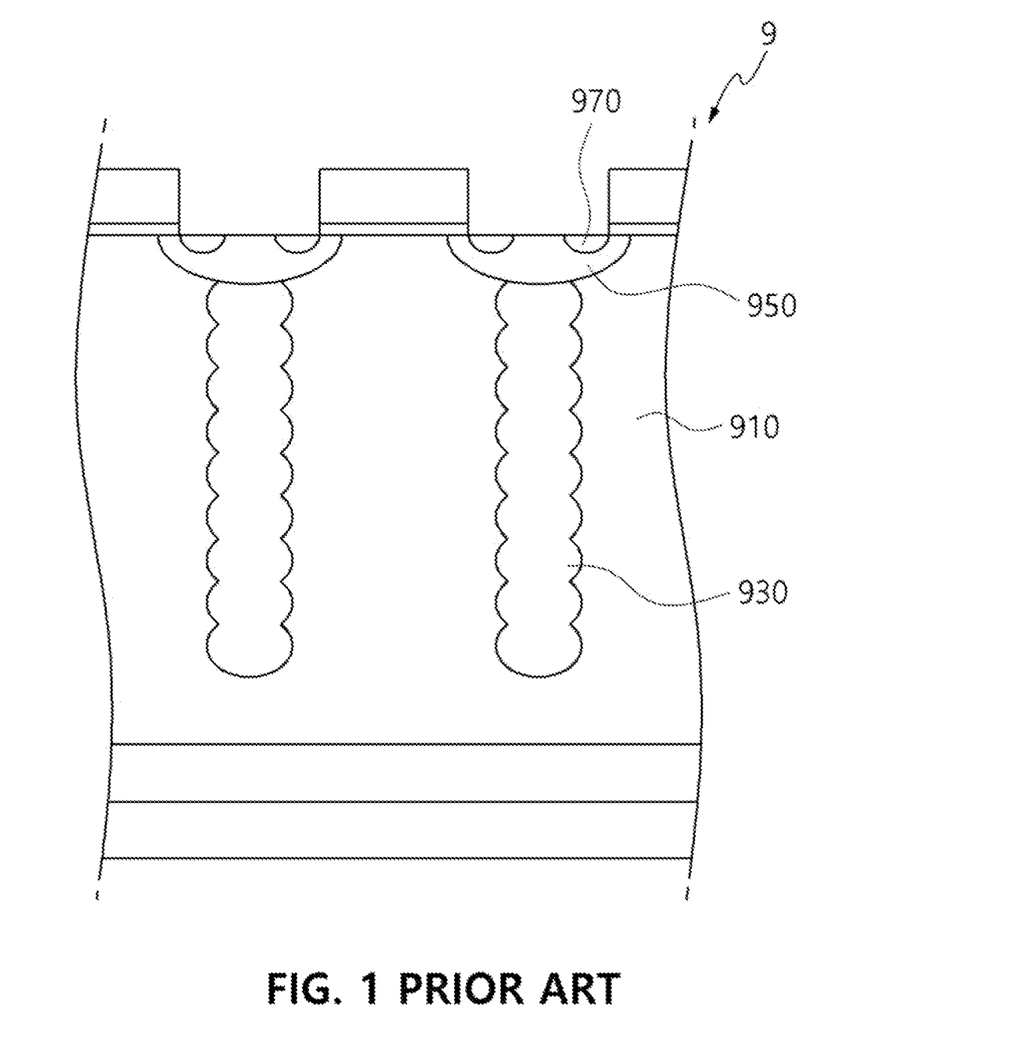
FIG. 1 is a cross-sectional view showing a conventional superjunction semiconductor device.
Figure 2:
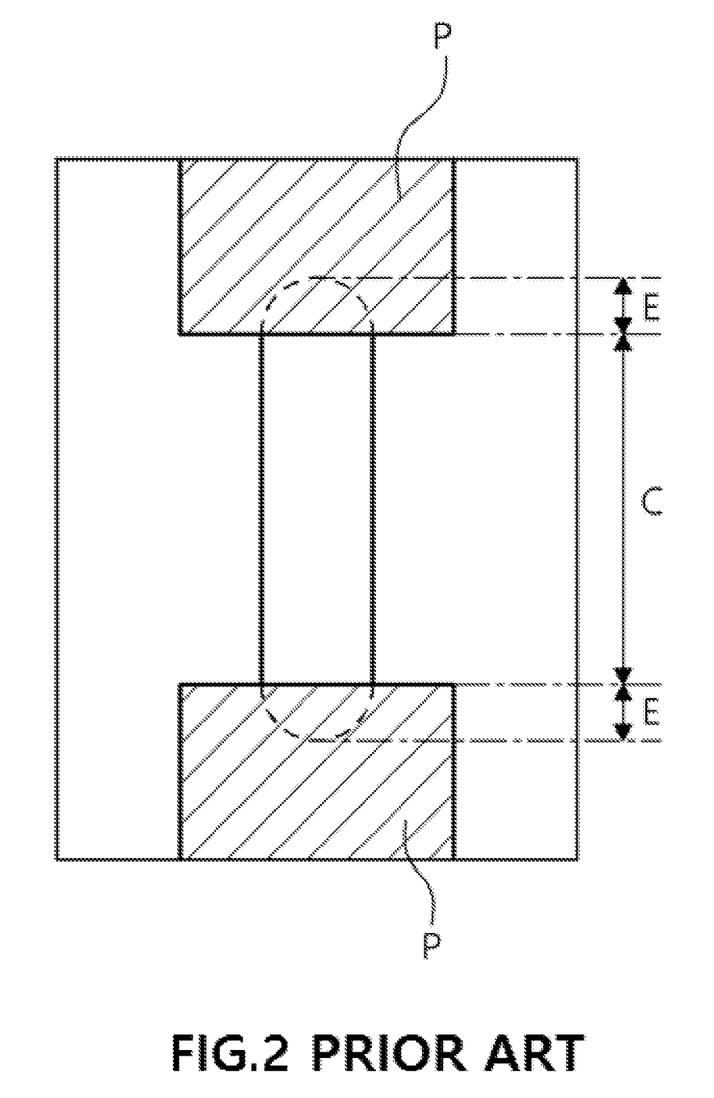
FIG. 2 is a plan view showing a mask for forming a source in the conventional superjunction semiconductor device in FIG. 1.

FIG. 1 is a cross-sectional view showing a conventional superjunction semiconductor device. FIG. 2 is a plan view showing a source in the conventional superjunction semiconductor device in FIG. 1.

In describing the structure of the conventional superjunction semiconductor device 9 and the method of manufacturing the same with reference to FIGS. 1 and 2, the first conductive type pillars 930 are spaced apart from each other in the gate second conductive type epitaxial layer 910. Furthermore, the first conductive type body region 950 is on each of the pillars 930. The two sources 970 are at left and right portions in the individual body region 950. Therefore, current paths may be provided in the epitaxial layer 910 at opposite sides of each of the pillars 930. The sources 970 may be defined at least in part by the mask pattern P, which overlaps the edge regions E and opens the core region C, and may be formed by injecting a second conductive type dopant into the body regions 950 in the presence of the mask P.

In a general high voltage and high current power system, during a short circuit fault, both a high voltage and a high current are applied to the device to cause high power consumption. Continuity of the high power consumption causes the temperature of the device to increase (e.g., a junction temperature increase), and the junction temperature increase may be a major factor in the destruction of the device. The conventional semiconductor device 9 includes two sources 970 in the body region 950, thus allowing channels in the epitaxial layers 910 at opposite sides of each of the pillars 930 as described above. Therefore, the short circuit current (Isc) may or should increase.

Figure 3:
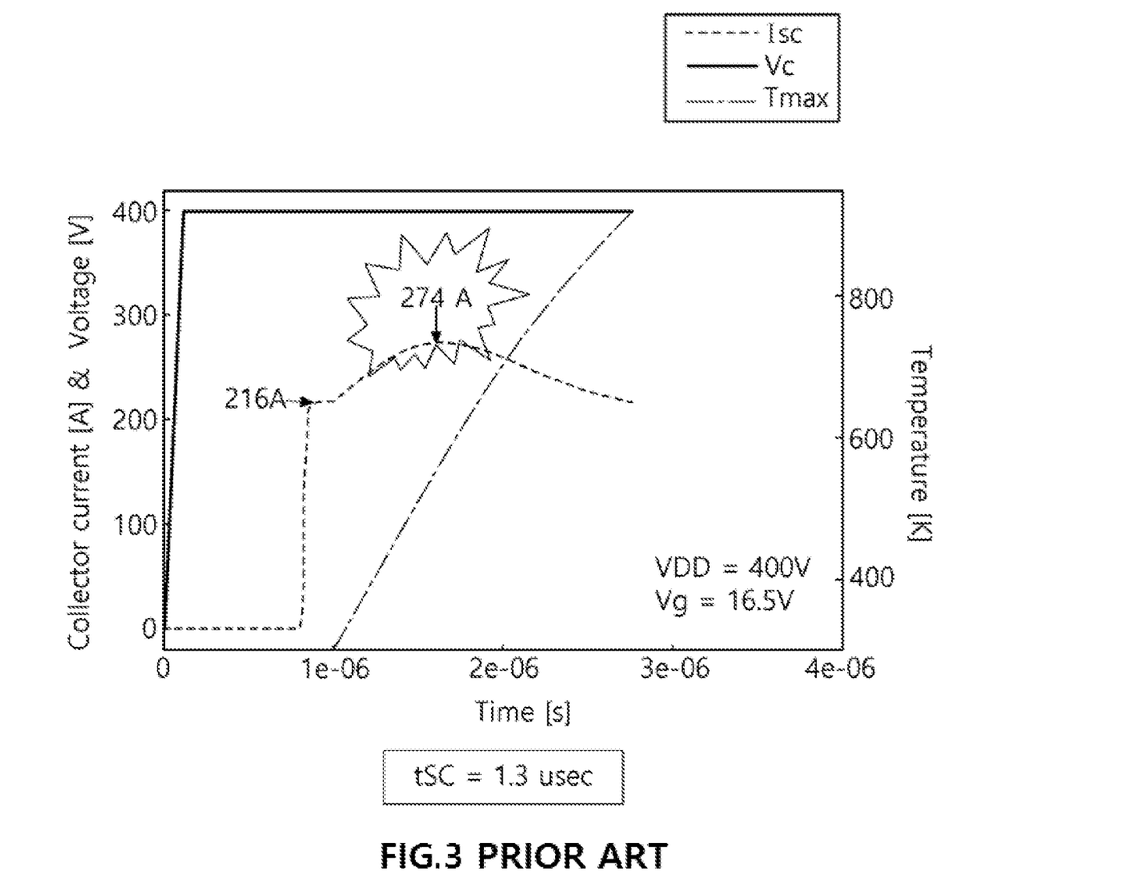
FIG. 3 is a graph showing a short circuit current peak value of the superjunction semiconductor device in FIG. 1.

FIG. 3 is a graph showing a short circuit current peak value in the superjunction semiconductor device of FIG. 1.

Referring to FIG. 3, a peak value of a short circuit current (Isc) in the conventional semiconductor device 9 is 274 A. When Vdd is 400 V and Vg is 16.5 V, a peak value of the short circuit current (Isc) in the conventional semiconductor device 9 is about 274 A, and the temperature in the device increases to over 800 K in less than 3 msec.

In order to solve the above problems, the inventors of the present disclosure have created a new superjunction semiconductor device having sources with a reduced area and an improved structure.

DOCUMENTS OF RELATED ART (Patent Document 1) Korean Patent Application Publication No. 10-2005-0052597 ('Superjunction semiconductor device')

SUMMARY OF THE INVENTION

Accordingly, the present disclosure has been made keeping in mind the above problems occurring in the related art, and the present disclosure is intended to provide a superjunction semiconductor device having a reduced source area and a method of manufacturing the same, the superjunction semiconductor device being configured to increase the time before device destruction in comparison to a conventional superjunction semiconductor device by realizing reduction in the area of the source in a body region, and lowering the value of the current during a short circuit fault, thus delaying the temperature increase (or reducing the rate of the temperature increase) in the device.

Another objective of the present disclosure is to provide a superjunction semiconductor device having a reduced source area and a method of manufacturing the same, the superjunction semiconductor device being configured to easily reduce the source area and promote processing convenience by allowing a mask pattern covering a peripheral region to partially cover a core region during formation of the source.

In order to achieve the above objectives, according to at least one aspect of the present disclosure, there is provided a superjunction semiconductor device including a substrate; a drain electrode under the substrate; an epitaxial layer on the substrate; a plurality of pillars spaced apart from each other in the epitaxial layer (e.g., and optionally alternating with the epitaxial layer); a first body region in the epitaxial layer, and connected to an upper portion of one of the plurality of pillars; and a source in the body region, wherein the source may be in a portion of a core region (and optionally in a longitudinal direction).

The superjunction semiconductor device may include a gate oxide film on the epitaxial layer, between the first body region and a second body region adjacent to the first body region; and a gate electrode on the gate oxide film.

The superjunction semiconductor device may include a body contact adjacent to the source in the body region or in contact with the source, and the source may include two source regions (i.e., a first source region and a second source region) in the body region.

Each of the source regions may be in a center portion of the core region (and/or in a center of the body region) in the longitudinal direction or adjacent to the center or center portion, but not at opposite ends (e.g., of the body region) adjacent to corresponding ones of a plurality of edge regions.

Each of the source regions may be adjacent to a corresponding one of the edge regions, and not at the center portion of the core region (or the center of the body region).

The superjunction semiconductor device may include a body contact adjacent to the source in the body region or in contact with the source. The source may include one source region in the body region, in the core region along the longitudinal direction.

In order to achieve the above objectives, according to another aspect of the present disclosure, there is provided a superjunction semiconductor device having a reduced source area, the superjunction semiconductor device including a substrate; a second conductive type epitaxial layer on the substrate; a plurality of pillars in the epitaxial layer, having a first conductive type and spaced apart from each other; a first body region in the epitaxial layer, having a first conductive type and connected to an upper portion of one of the plurality of pillars; two second conductive type sources in the first body region and spaced apart from each other along a cross-direction in a core region; a first conductive type body contact in the first body region and adjacent to each of the sources or in contact with each of the sources; a gate oxide film on the epitaxial layer, between the first body region and a second body region adjacent to the first body region; and a gate electrode on the gate oxide film, wherein the core region may include a non-source region excluding each of the two sources in the core region, and an area of the non-source region may be less than a total area of the core region, and optionally, less than a total rear area of the first body region.

The area of the non-source region may be within a range equal to or higher than 35% and less than or equal to 85% of the total area of the core region (or the first body region).

The non-source region may be separate from each of a plurality of opposite edge regions (e.g., outside the core region).

The non-source region may be adjacent to each of the opposite edge regions. A first non-source region may also be spaced apart from a second non-source region in a longitudinal direction in the core region.

In order to achieve the above objectives, according to yet another aspect of the present disclosure, there is provided a method of manufacturing a superjunction semiconductor device having a reduced source area, the method including providing an epitaxial layer on a substrate; providing a plurality of pillars spaced apart from each other in the epitaxial layer; providing a first body region connected to an upper portion of one of the pillars in the epitaxial layer; and providing a source in the body region, in a limited location in a core region.

Providing the source may comprise providing a mask pattern over edges and one side of the core region in a cross-direction (e.g., to cover a whole length of the core region), and implanting a dopant into the epitaxial layer with the mask pattern in place.

Providing the sources may comprise providing the mask pattern over the edge regions and a center portion of the core region in the longitudinal direction (and optionally a location adjacent to the center portion; e.g., to cover the whole width of the body region in the center of the core region), and implanting the dopant into the epitaxial layer with the mask pattern in place.

Providing the sources may comprise covering the edge regions and a portion of the core region connected to each of the edge regions with the mask pattern and injecting the dopant (e.g., into the epitaxial layer).

The method may further include providing a body contact in the body region; providing a gate oxide film on the epitaxial layer; and providing a gate electrode on the gate oxide film.

In order to achieve the above objectives, according to a further aspect of the present disclosure, there is provided a method of manufacturing a superjunction semiconductor device having a reduced source area, the method including providing a second conductive type epitaxial layer on a substrate; providing a plurality of first conductive type pillars spaced apart from each other in the epitaxial layer; providing a gate oxide film on the epitaxial layer; providing a gate electrode on the gate oxide film; providing a first conductive type body region connected to an upper portion of one of the pillars in the epitaxial layer; providing two sources in the body region, at limited locations in a longitudinal direction of a core region; providing a non-source region in the core region in the longitudinal direction, wherein the non-source region (which may also be in the first body region) does not contain the sources); and providing a first conductive type body contact in the body region.

Each of the sources may have a longitudinal length that may be more than half of a length of the core region in the longitudinal direction.

The present disclosure has the following effects.

The superjunction semiconductor device of the present disclosure realizes a reduction in the area of the source(s) in the body region and lowers the value of the current during a short circuit fault, thus delaying or reducing the rate of the related temperature increase in the device, so that the time before device destruction can be increased in comparison to a conventional superjunction semiconductor device.

Furthermore, the superjunction semiconductor device of the present disclosure is configured to allow a mask pattern covering a peripheral region to partially cover a core region (e.g., in an active area of the device) during formation of the source, easily reducing the source area and promoting process convenience.

Even if certain effects are not explicitly mentioned in the specification, the effects described in the following specification expected by the technical characteristics of the present disclosure and potential effects thereof are treated as if the effects are described in the present disclosure.

BRIEF DESCRIPTION OF THE DRAWINGS

The above and other objectives, features, and other advantages of the present disclosure will be more clearly understood from the subsequent detailed description when taken in conjunction with the accompanying drawings, in which.

DETAILED DESCRIPTION OF THE INVENTION

Hereinbelow, embodiments of the present disclosure will be described in detail with reference to the accompanying drawings. It should be understood that the embodiment(s) of the present invention may be changed to a variety of embodiments, and the scope and spirit of the present invention are not limited to any particular embodiment described hereinbelow. The embodiments of the present invention described hereinbelow are provided for allowing those skilled in the art to more clearly comprehend the present invention.

Hereinbelow, if it is described that a first component (or layer) is on a second component (or layer), it should be understood that the first component may be directly on the second component, or one or more components or layers may be between the components. Furthermore, if it is described that the first component is directly on the second component, no additional components are between the first and second components. A location 'on', 'upper', 'lower', 'above', and 'below' or 'beside' the first component may describe a relative location relationship.

Terms such as 'a first ~', 'a second ~', and 'a third ~' are used only for the purpose for describing various elements such as various components, regions, and/or parts, and the various elements are not limited to the terms.

It should also be noted that, in cases where certain embodiments are otherwise practicable, certain process sequences may be performed differently from those described below. For example, two processes described in succession may be performed substantially simultaneously or in a reverse order.

The term MOS (metal-oxide-semiconductor) used herein is a general term, and 'M' is not limited to metal, but may encompass any of various types of conductors. In addition, 'S' may be a substrate or a semiconductor structure, and 'O' may be an oxide such as silicon dioxide, but is not limited to oxides, and may include various types of organic or inorganic insulating materials.

In addition, a conductive or a doped region of the components may be defined as 'P-type' or 'N-type' depending on the main carrier properties, but such labels are only for convenience of the description, and the technical idea of the present disclosure is not limited to the embodiment. For example, 'P-type' or 'N-type' may be replaced herein with the more general terms 'first conductive type' or 'second conductive type'. The first conductive type may refer to P-type, and the second conductive type may refer to N-type, but the present disclosure is not limited to this correlation.

Hereinbelow, prior to describing a superjunction semiconductor device 1 having a reduced source area according to a first embodiment of the present disclosure, an array structure of a general superjunction semiconductor device will be described.

Referring to FIG. 2, the general superjunction semiconductor device has a core region C providing a current path in a channel between the source and the drain when a gate—source voltage is applied. Edge regions E function as a termination region for the channel (e.g., the channel does not format or beyond the edge regions E). In general, sources are not in the edge regions E. Furthermore, the edge regions E are formed at opposite ends or sides of the core region C (e.g., in the Y-axis direction in FIG. 2). For example, the edge regions E may be curved (e.g., when the structure defining the edge regions E is defined by photolithographic patterning), but the present disclosure is not limited thereto.

Hereinbelow, for convenience of the description, in the plan views shown in the drawings, the X-axis direction is referred as 'a cross-direction' and the Y-axis direction is referred as 'a longitudinal direction'.

Figure 4:
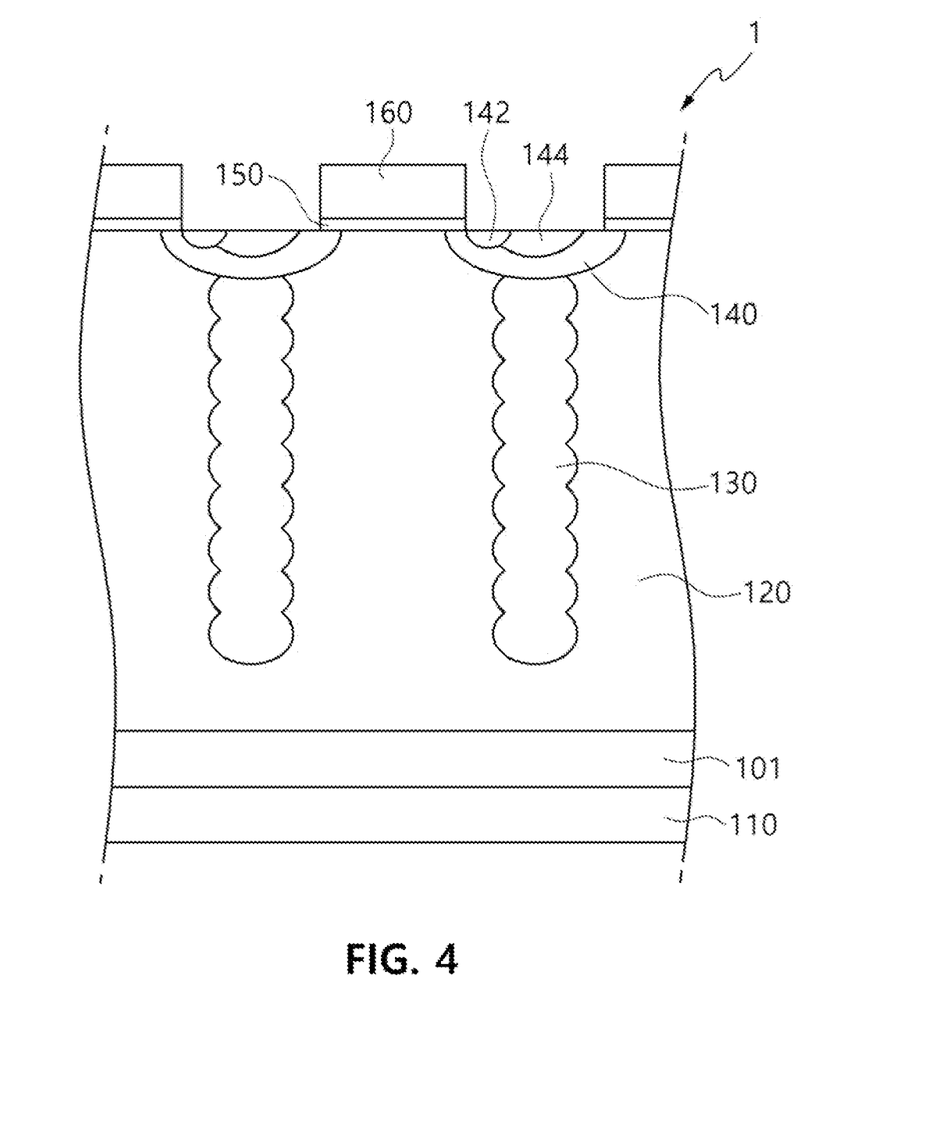
FIG. 4 is a cross-sectional view showing a superjunction semiconductor device having a reduced source area according to a first embodiment of the present disclosure.

FIG. 4 is a cross-sectional view showing a superjunction semiconductor device having sources with a reduced area according to a first embodiment of the present disclosure.

Hereinbelow, the superjunction semiconductor device 1 having a reduced source area will be described in detail with reference to accompanying drawings. According to a first embodiment of the present disclosure, the superjunction semiconductor device 1 includes a cell region (active region) and a ring region (termination region) enclosing the cell region. Furthermore, a transition region is between the cell region and the ring region. For convenience of the description, in the present disclosure, only the cell region, i.e., the active region including one or more source regions and other structures for transistor activity, will be described in detail.

Referring to FIG. 4, the present disclosure relates to the superjunction semiconductor device 1 having sources with a reduced area and, more particularly, to a semiconductor device 1 configured to realize a reduction in the area of a source in a body region to reduce the value of the short circuit current, Isc, and thus delay or reduce the rate of junction temperature increase and increase the time (tsc) before device destruction.

The semiconductor device 1 may include, for example, a substrate 101, such as a silicon substrate, a germanium substrate, etc., or a bulk wafer with an epitaxial layer (or "epi-layer") thereon. The substrate 101 may comprise, for example, a heavily doped second conductive type substrate. A drain electrode 110 is under the substrate.

An epitaxial layer 120 is on the substrate 101. The epitaxial layer 120 may comprise, for example, a lightly doped second conductive type epitaxial layer (e.g., having the same or substantially the same crystal structure and/or lattice as the substrate 101). A plurality of pillars 130, which are first conductive type dopant regions, may be in the epitaxial layer 120, spaced apart from each other in a transversal direction. The pillars 130 may extend vertically toward the lower side (e.g., the drain electrode 110), and surfaces thereof in contact with the epitaxial layer 120 may be flat or curved, but the scope of the present disclosure is not limited to a specific shape.

One or more body regions 140 may be in the epitaxial layer 120, and each body region 140 may be on an upper portion of a corresponding one of the pillars 130. The body region 140 has the first conductive type. The body region 140 may include a plurality of body regions 140 so that the body regions 140 may be respectively connected to upper portions of the pillars 130 in an upper portion of the epitaxial layer 120. A source 142, e.g., a second conductive type dopant region, is in each of the body regions 140. A body contact 144 may be at a location adjacent to the source 142 or in contact with the source 142.

Furthermore, a gate oxide film 150 is on the epitaxial layer 120, between adjacent body regions 140. The gate oxide film 150 preferably overlaps partially with the body regions 140. The gate oxide film 150 comprises or consists of at least one of a silicon oxide film, a high dielectric film, and a combination thereof.

Furthermore, a gate electrode 160 comprising or consisting of, e.g., a polysilicon film is on the gate oxide film 150. A channel region may be turned on and off by a voltage applied to the gate electrode 160. The gate electrode 160 may comprise or consist of, for example, conductive (i.e., doped) polysilicon, a metal, a conductive metal nitride, or a combination of two or more of conductive polysilicon, a metal, a refractory metal silicide, and a conductive metal nitride.

Hereinbelow, the structure of the conventional superjunction semiconductor device 9, a problem of the superjunction semiconductor device 9, and the superjunction semiconductor device 1 having a reduced source area according to the present disclosure to solve the problem will be described in detail.

Referring to FIGS. 1 and 2, in describing the structure of the conventional superjunction semiconductor device 9 again, the first conductive type pillars 930 are in the second conductive type epitaxial layer 910, spaced apart from each other. Furthermore, a first conductive type body region 950 is on each of the pillars 930. The two sources 970 are in left and right sides of the individual body region 950. Therefore, current paths may be provided in the epitaxial layer 910 at opposite sides of each of the pillars 930.

In a general high voltage and high current power system, during a short circuit fault, both a high voltage and a high current are applied to the device, causing high power consumption. Continuous high power consumption causes a temperature increase in the device, and a junction temperature increase may be a major factor of device destruction. The conventional semiconductor device 9 includes the two sources 970 in the body region 950, and thus allowing channels to be formed in the epitaxial layers 910 at the opposite sides of each of the pillars 930 as described above. Therefore, the short circuit current (Isc) may be relatively high.

Figure 5:
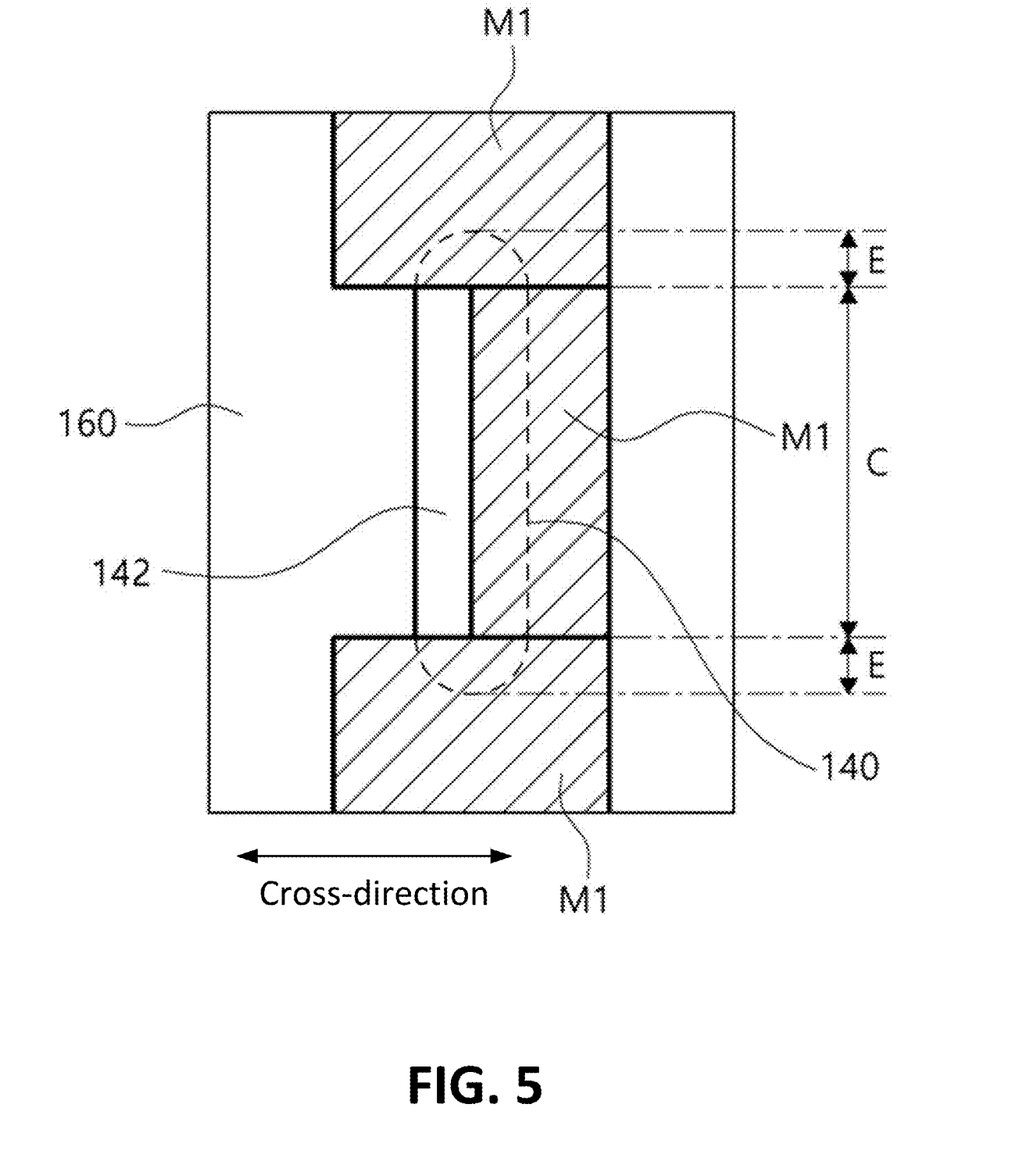
FIG. 5 is a plan view showing a mask for forming a source in the superjunction semiconductor device according to the first embodiment of the present disclosure.
Figure 6:
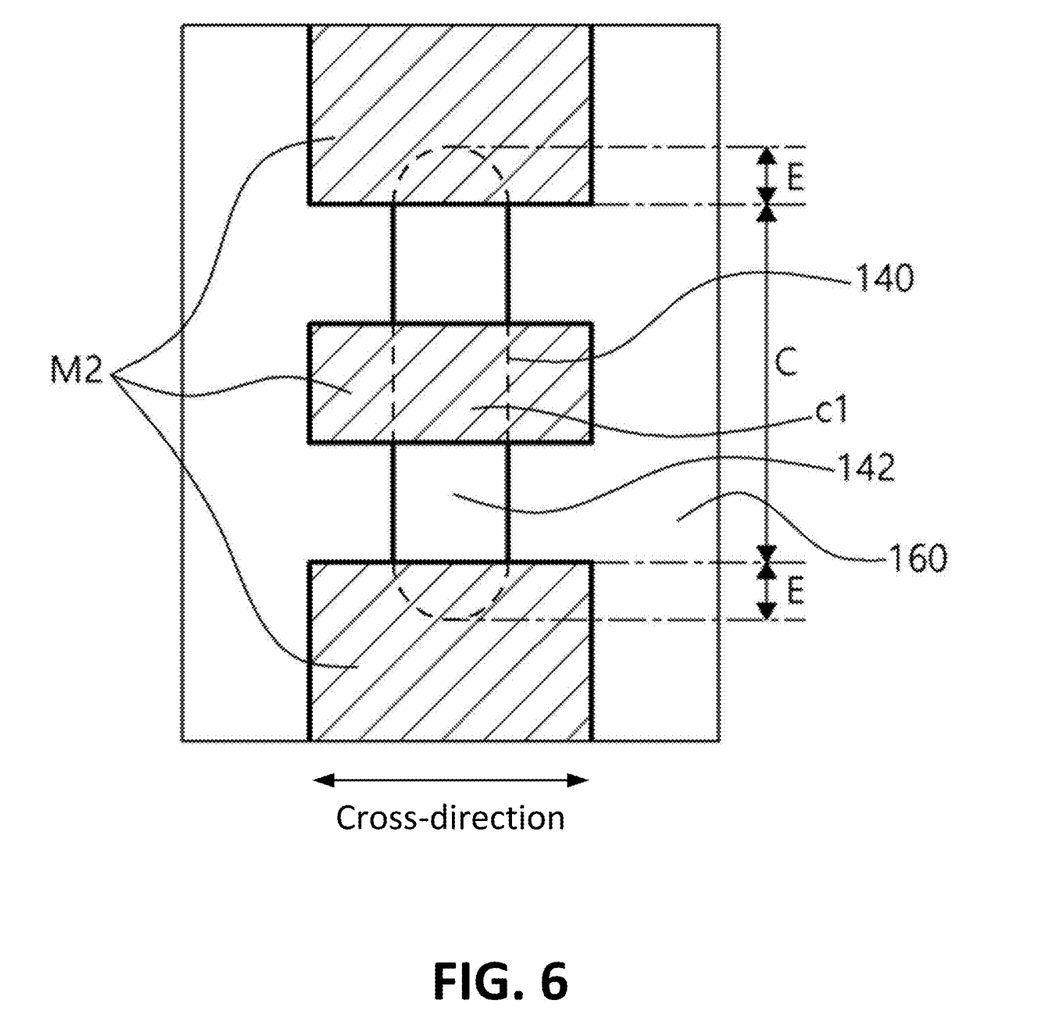
FIG. 6 is a plan view showing a mask for forming a source in a superjunction semiconductor device according to a second embodiment of the present disclosure.
Figure 7:
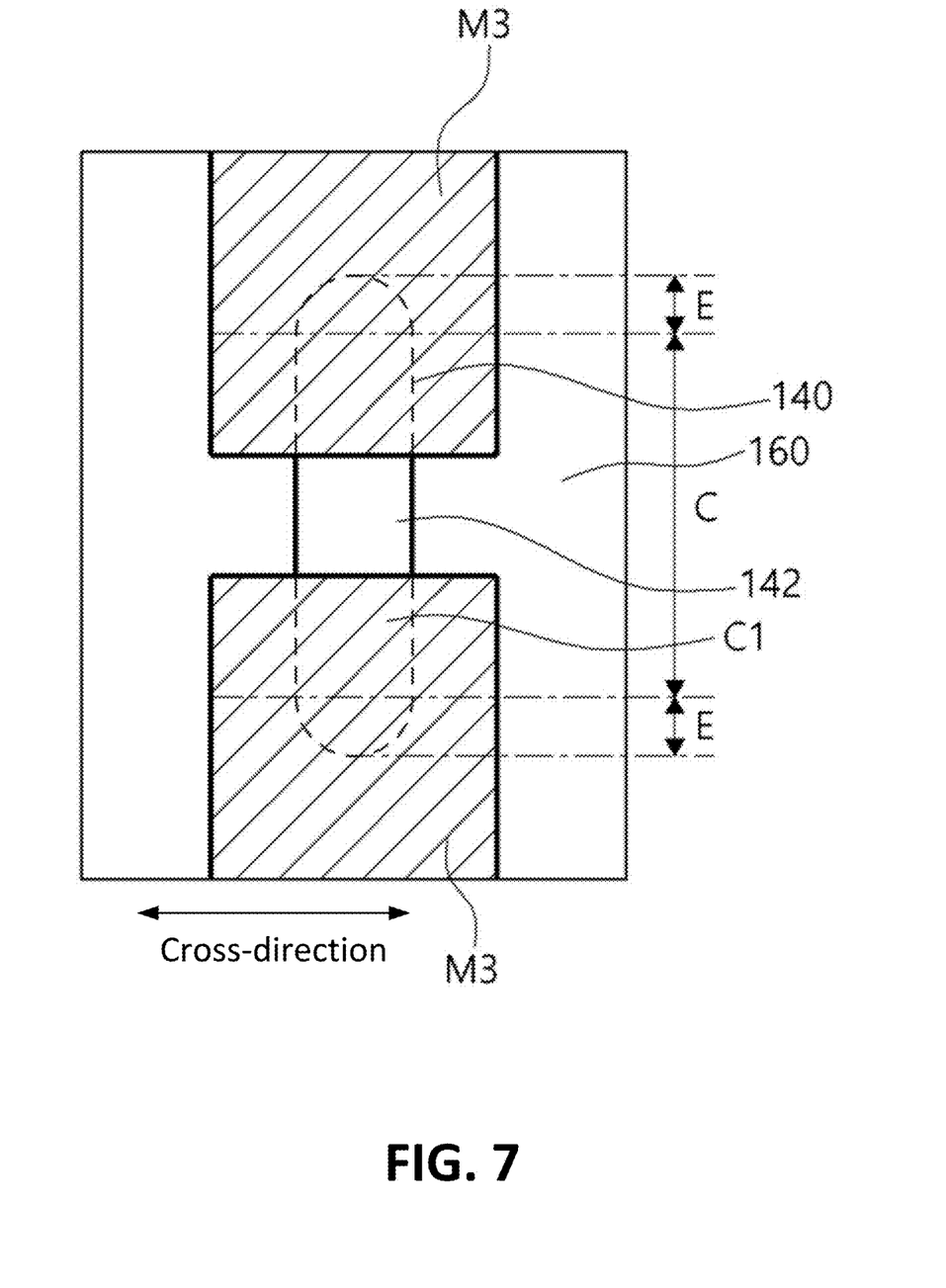
FIG. 7 is a plan view showing a mask for forming a source in a superjunction semiconductor device according to a third embodiment of the present disclosure.

In order to solve the above problem, according to the first embodiment of the present disclosure, the superjunction semiconductor device 1 having a source with a reduced area includes the source 142 only in a limited location or area along a longitudinal direction or a cross-direction of the core region C (see, e.g., FIGS. 5-7).

FIG. 5 is a plan view showing a mask for forming a source in the superjunction semiconductor device according to the first embodiment of the present disclosure.

Referring to FIG. 5, as the first embodiment, one source 142 may be in the body region 140 along an entire length (e.g., longitudinal direction) of the core region C. The source 142 may be in the same location in each individual body region 140. For example, the source 142 may be on the left side or the right side of the body contact 144 (not shown in FIG. 5) and/or of an individual body region 140 in the core region C. Alternatively, the sources 142 may be on the side of the corresponding body regions 140 closest to the gate electrode 160. The semiconductor device with such a structure may have a channel density of about 50% compared to the channel density of the conventional semiconductor device 9.

FIG. 6 is a plan view showing a mask for forming one or more sources in the body region in a superjunction semiconductor device according to a second embodiment of the present disclosure.

Referring to FIG. 6, according to the second embodiment, the source(s) 142 may be at each of opposite ends or portions of the body region 140, but not in a center portion of the body region 140, along the longitudinal direction in the core region C. In detail, the individual body region 140 may include two sources 142, and the two sources 142 may be at the opposite ends or portions of the body region 140 adjacent to the edge regions E, but not in the center portion or section along the longitudinal direction. For example, the longitudinal length of a (central) non-source region C1 in the body region 140 may be equal to or higher than 35% and less than or equal to 85% of the longitudinal length of the core region C (or any value or range of values therein, such as 50-85%). When the longitudinal length of the non-source region C1 is less than 35%, it is difficult to achieve the purpose of the present disclosure, and when the longitudinal width value is higher than 85%, the on-resistance of the device increases, thus reducing efficiency of the semiconductor device.

FIG. 7 is a plan view showing a mask for forming one or more sources in the body region in a superjunction semiconductor device according to a third embodiment of the present disclosure.

Referring to FIG. 7, according to the third embodiment, the source 142 is in the center portion of the body region 140 along the longitudinal direction of the core region C, and may not be in the ends or portions of the body region 140 adjacent to the edge regions E. After formation of the body contact (not shown), there may be two sources 142 in the center portion of the individual body region 140. For example, the total or cumulative longitudinal length of the non-source regions C1 at the opposite ends of the body region 140 may be equal to or higher than 50% and less than or equal to 85% of the total longitudinal length of the core region C, but the present disclosure is not limited thereto. The semiconductor device with such a structure has a processing advantage, and a detailed description thereof will be provided below.

Figure 8:
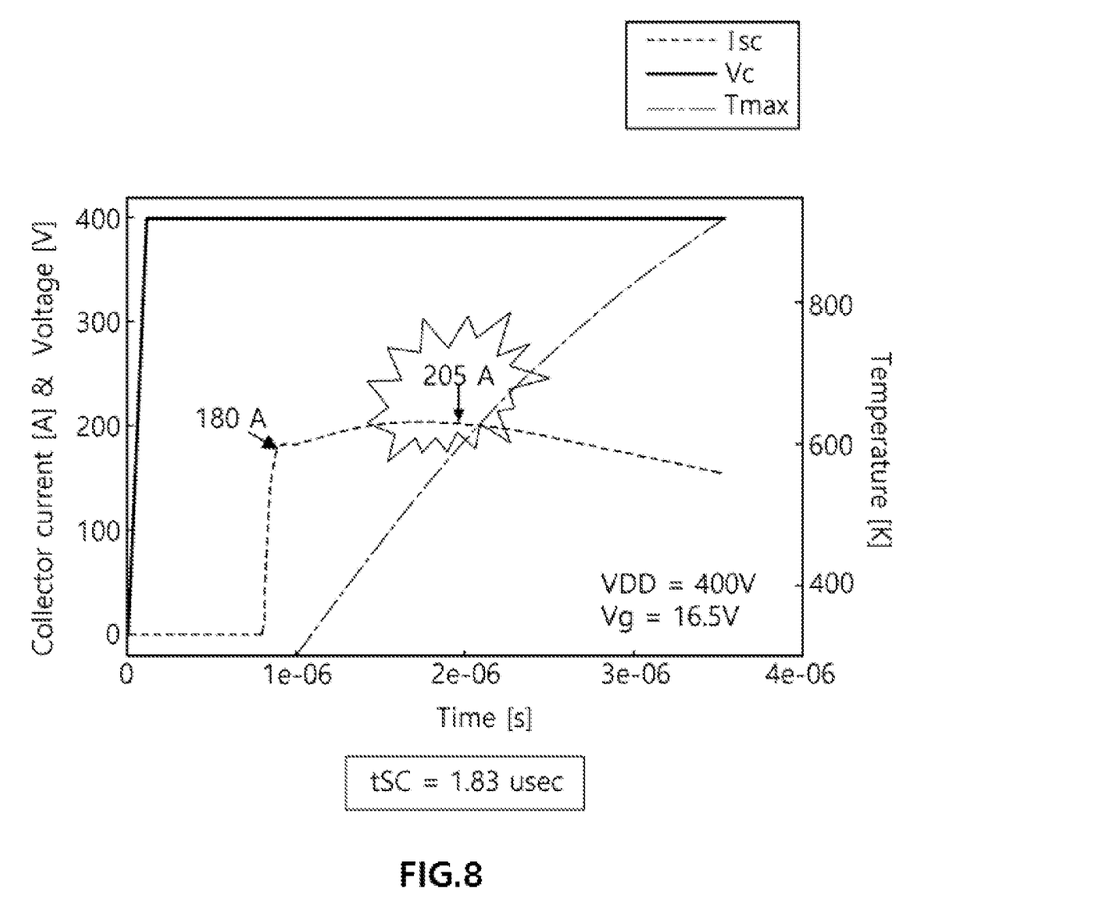
FIG. 8 is a graph showing a peak value of a short circuit current in the superjunction semiconductor device according to the first embodiment in FIG. 5.

FIG. 8 is a graph showing the peak value of a short circuit current in the superjunction semiconductor device according to the first embodiment in FIG. 5.

As the semiconductor device is configured with the structure shown in FIG. 4, a peak value of the short circuit current (Isc) of the semiconductor device is reduced compared to the conventional semiconductor device 9 (compare FIGS. 3 and 8), and the time of junction temperature increase also increases, confirming that the survival time of the device increases. When Vdd is 400V and Vg is 16.5V, a peak value of the short circuit current (Isc) is about 274 A in the conventional semiconductor device 9. However, when the cross-directional width of the non-source region C1 is about 50% of the width of the body region 140 as in the first embodiment of the present disclosure, the peak value is significantly lowered to 205 A. Therefore, the rate of the junction temperature increase is also significantly reduced.

Figure 9:
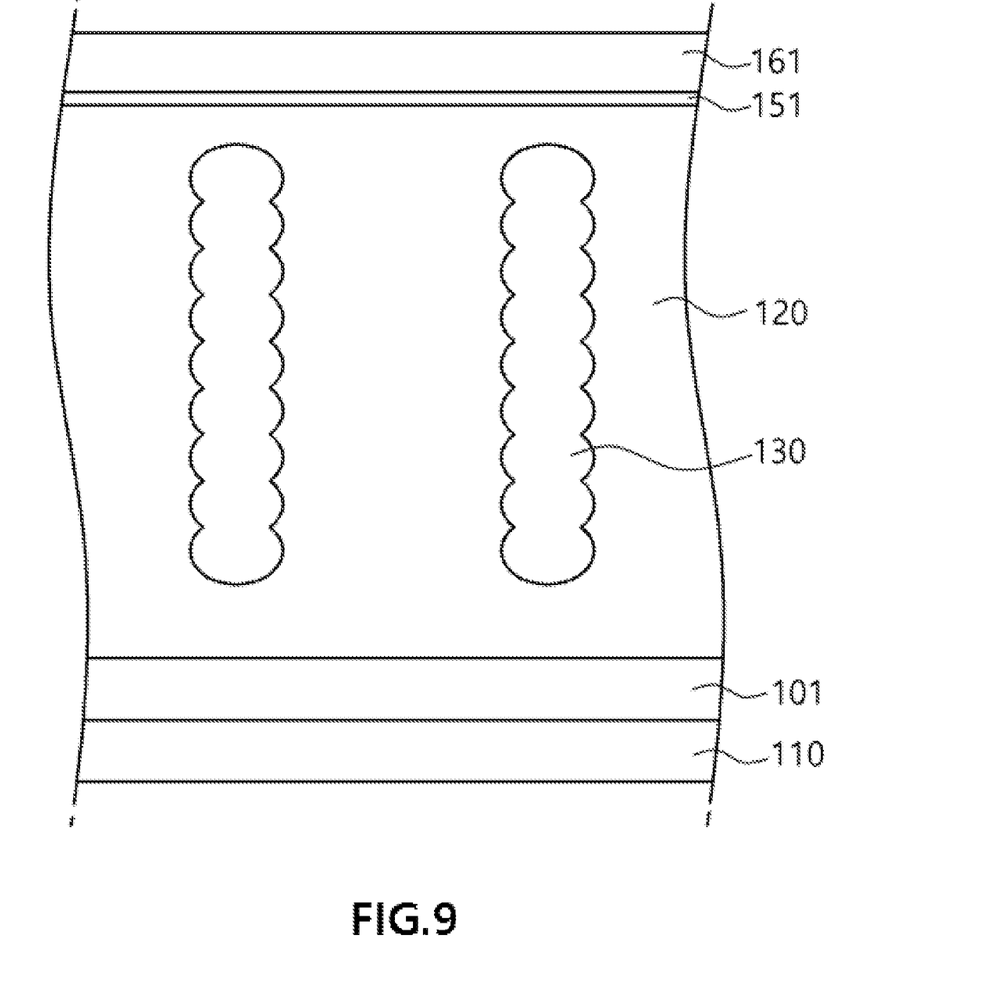
FIGS. 9 to 11 are views showing a method of manufacturing the superjunction semiconductor device according to one or more embodiments of the present disclosure.
Figure 10:
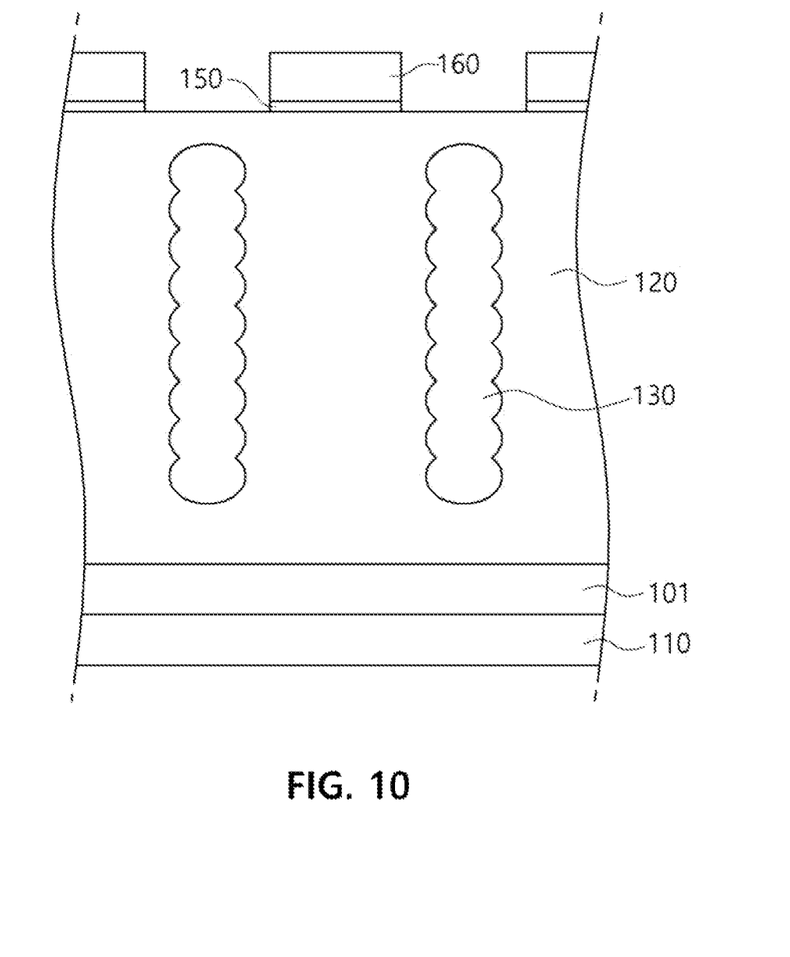
Figure 11:
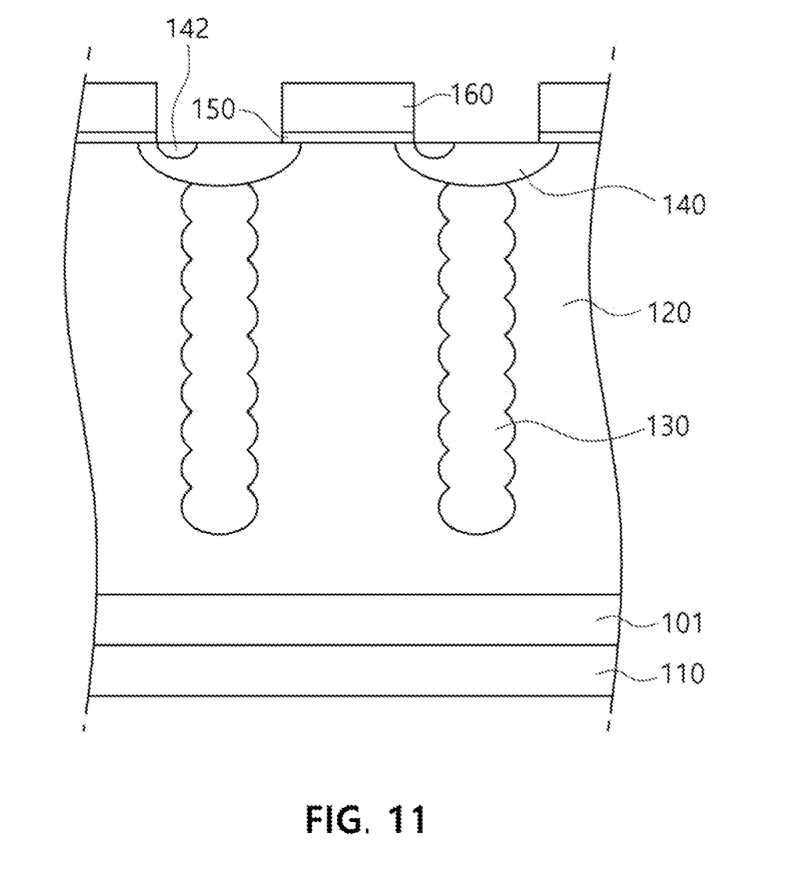

FIGS. 9 to 11 are views showing a method of manufacturing the superjunction semiconductor device having a reduced source area according to one or more embodiments of the present disclosure.

Hereinbelow, a method of manufacturing a superjunction semiconductor device having a reduced source area according to the present disclosure will be described in detail with reference to accompanying drawings. It should be noted that each step of forming the components may differ in time from that described, or may be conducted substantially simultaneously. In addition, the method(s) of manufacturing the components are described only for illustrative purposes, and the scope of the present disclosure is not limited by the examples provided.

Referring to FIG. 9, the second conductive type epitaxial layer 120 and the pillars 130 are formed on the substrate 101. The epitaxial layer 120 may comprise crystalline silicon doped with a second conductive type dopant, and may be formed by, for example, epitaxial growth. Then, one or more deep trenches (not shown) may be formed, extending into the epitaxial layer 120 from an upper surface thereof. A plurality of trenches may be formed, spaced apart from each other. Furthermore, the trench(es) may be formed by, for example, an etching process using a mask pattern. Then, the mask pattern is removed. After the removal of the mask pattern, the pillars 130 may be formed. For example, a semiconductor material containing the first conductive type dopant is deposited onto the epitaxial layer 120 and into the trenches, and then a CMP process is performed to expose the upper surface of the epitaxial layer 120, and the semiconductor material remains in the trenches. In a further embodiment, the semiconductor material deposition process and the CMP process may be repeatedly performed until the trench (es) are completely filled.

In another embodiment, a plurality of second conductive type epi-layers are successively formed, and in a predetermined area of each of the epi-layers (i.e., after each formation of an epi-layer), a first conductive type dopant is implanted therein. Thereafter, a diffusion process (e.g., heating or thermal annealing) is performed to form the epitaxial layer 120 and the pillars 130. However, in the present disclosure, the formation processes of the epitaxial layer 120 and the pillars 130 are not limited to the above description, and are described for illustrative purposes.

After the formation of the pillars 130, an insulator film 151 is formed on the epitaxial layer 120, and a gate film 161 is formed on the insulator film 151. The insulator film 151 may comprise silicon dioxide, a high-k insulating material, or a combination thereof, and the gate film 161 may comprise a conductive polysilicon film.

After forming the gate film 161, and now referring to FIG. 10, a mask pattern (not shown) is formed on the gate film 161 (e.g., by photolithographic patterning), and the gate film 161 and the insulator film 151 are sequentially etched by in the presence of the mask pattern, resulting in the gate oxide film 150 and the gate electrode 160. The gate electrode 160 may have a stripe or strip-like shape, and may be between the pillars 130.

After the formation of the gate electrode, and now referring to FIG. 11, the body region 140 is formed. In detail, the body region 140 may be formed by injecting or implanting a first conductive type dopant into the upper portion of the epitaxial layer 120 and each of the pillars 130 with the gate electrode 160 as a mask. An additional mask (not shown) may be formed by photolithography to block implantation of the first conductive type dopant into regions of the epitaxial layer 120 in which the body region 140 is not desired and that are not masked by the gate electrode 160.

Then, in order to form the source 142, a second conductive type dopant is injected or implanted into the body region 140.

For example, referring to FIGS. 5 and 11, the mask pattern M1 is formed, covering the edge regions E and part of a cross-directional width of the body region 140 in the core region C, and then the source 142 may be formed by injecting the second conductive type dopant into the body region 140. Specifically, after the formation of the mask pattern M1 covering about half of the cross-directional width of the body region 140, the second conductive type dopant may be injected or implanted to form the source 142. Thereafter, the mask pattern M1 is removed, a new mask (not shown) is formed (e.g., by photolithographic patterning) exposing the area of the body region 140 in which the body contact 144 is to be formed (see, e.g., FIG. 4), and a first conductive dopant is injected or implanted into the body region 140 to form the body contact 144. This exposed area of the body region 140 partially overlaps with the source 142 to ensure that the body contact 144 electrically contacts the source 142. Therefore, the single source 142 may be in the body region 140 along the entire longitudinal length of the core region C. Therefore, the present device may have a channel density that is 50% (or about 50%) of the channel density of the conventional semiconductor device 9 in FIG. 1.

In another embodiment, and now referring to FIG. 6, a mask pattern M2 may be formed over the edge regions E and in a center region of the body region 140 along the longitudinal direction, covering the cross-directional width of the body region 140. Therefore, the source 142 is not formed in the center of the body region 140 along the longitudinal direction in the core region C, and two sources 142 may be formed in the body region 140 adjacent to the edge regions E.

In yet another embodiment, and now referring to FIG. 7, a mask pattern M3 may cover the body region 140 in the edge regions E and partially cover the body region 140 in the core region C. The mask pattern M3 may be formed by extending a dimension of a conventional mask pattern covering only the edge regions E (see, e.g., FIG. 2), so a processing advantage may arise in this embodiment. As a result, the source 142 is not formed only in end portions of the body region 140 along the longitudinal direction (e.g., adjacent to the edge regions E), and two sources 142 are formed in each body region 140 in the center of the core region C.

The detailed descriptions disclosed herein are only to illustrate the present disclosure. Furthermore, the foregoing is intended to represent and describe various embodiments of the present disclosure, and the present disclosure may be used in various other combinations, variations, and environments. Changes or modifications are possible within the scope of the concept of the invention disclosed herein, the scope equivalent to the written disclosure, and/or within the scope of skill or knowledge in the art. The above-described embodiments describe the best state for implementing the technical idea of the present disclosure, and various changes in specific application fields and uses of the present disclosure are possible. Therefore, the detailed description of the above invention is not intended to limit the present disclosure to the disclosed embodiments.

What is claimed is:

1. A superjunction semiconductor device, comprising:
a substrate;
a drain electrode under the substrate;
an epitaxial layer on the substrate;
a plurality of pillars spaced apart from each other in the epitaxial layer;
a first body region in the epitaxial layer, connected to an upper portion of one of the plurality of pillars and having a longitudinal direction and a cross-direction in a plan view thereof;
a source in the first body region;
a core region providing a current path in a channel between the source and the drain when a gate-source voltage is applied and having a length along the longitudinal direction; and
edge regions at opposite ends of the core region along the longitudinal direction, wherein each of the edge regions functions as a termination region for the channel, and the first body region is in the core region and the edge regions,
wherein the source is in a portion of the core region,
the source comprises two source regions spaced apart from each other along the cross-direction in the first body region, and
each of the source regions is in a center portion of the body region along the longitudinal direction, but not in either of opposite ends of the first body region in the core region between each of the edge regions and the center portion of the first body region, and the opposite ends of the first body region not containing the source regions have a total or cumulative length in the longitudinal direction equal to or higher than 50% and less than or equal to 85% of the length of the core region.

2. The superjunction semiconductor device of claim 1, further comprising:
a gate oxide film on the epitaxial layer, between the first body region and a second body region adjacent to the first body region; and
a gate electrode on the gate oxide film.

3. The superjunction semiconductor device of claim 2, further comprising:
a body contact adjacent to the source in the body region or in contact with the source.

4. The superjunction semiconductor device of claim 2, comprising the second body region.

5. The superjunction semiconductor device of claim 4, wherein the second body region is in the epitaxial layer and connected to an upper portion of another one of the plurality of pillars.

6. The superjunction semiconductor device of claim 1, wherein the epitaxial layer is on an opposite side of the substrate from the drain electrode.

7. A superjunction semiconductor device, comprising:
a substrate;
a second conductive type epitaxial layer on the substrate;
a plurality of pillars in the epitaxial layer, having a first conductive type and spaced apart from each other;
a first body region in the epitaxial layer, having the first conductive type and a longitudinal direction and a cross-direction in a plan view thereof, connected to an upper portion of one of the plurality of pillars;
a core region overlapping the first body region and having a length along the longitudinal direction;
two second conductive type sources in the first body region and spaced apart from each other along the cross-direction in the core region;
edge regions at opposite ends of the core region along the longitudinal direction, wherein a current path is not formed in the edge regions,
a first conductive type body contact in the first body region and adjacent to each of the two sources or in contact with each of the two sources;
a gate oxide film on the epitaxial layer, between the first body region and a second body region adjacent to the first body region; and
a gate electrode on the gate oxide film,
wherein the two sources are in the core region, the core region comprises a non-source region excluding each of the two sources, and the non-source region has a length equal to or higher than 35% and less than or equal to 85% of a length of the core region along the longitudinal direction, and each of the sources is not in a center portion of the first body region, but is in each of opposite ends of the first body region between each of the edge regions and the center portion of the first body region, along the longitudinal direction.

8. The superjunction semiconductor device of claim 7, wherein the non-source region is separate from each of the edge regions.

9. The superjunction semiconductor device of claim 7, wherein the non-source region has an area that is 35-85% of a total area of the first body region.

10. The superjunction semiconductor device of claim 7, further comprising a drain electrode under the substrate.

11. The superjunction semiconductor device of claim 10, wherein the epitaxial layer is on an opposite side of the substrate from the drain electrode.

12. The superjunction semiconductor device of claim 7, comprising the second body region.

13. The superjunction semiconductor device of claim 12, wherein the second body region is in the epitaxial layer and connected to an upper portion of another one of the plurality of pillars.

* * * * *